(12) United States Patent
Shomori et al.

(10) Patent No.: US 10,186,436 B2
(45) Date of Patent: Jan. 22, 2019

(54) SUBSTRATE PROCESSING SYSTEM AND SUBSTRATE PROCESSING METHOD

(71) Applicant: J.E.T. CO., LTD., Asakuchi-gun, Okayama (JP)

(72) Inventors: Hirofumi Shomori, Okayama (JP); Atsuo Kimura, Okayama (JP)

(73) Assignee: J.E.T. CO., LTD., Asakuchi-gun, Okayama (JP)

( * ) Notice: Subject to any disclaimer, the term of this patent is extended or adjusted under 35 U.S.C. 154(b) by 0 days.

(21) Appl. No.: 15/737,641

(22) PCT Filed: Jun. 14, 2016

(86) PCT No.: PCT/JP2016/067666
§ 371 (c)(1),
(2) Date: Dec. 18, 2017

(87) PCT Pub. No.: WO2016/204143
PCT Pub. Date: Dec. 22, 2016

(65) Prior Publication Data
US 2018/0158700 A1  Jun. 7, 2018

(30) Foreign Application Priority Data

Jun. 19, 2015  (JP) ................................. 2015-123461

(51) Int. Cl.
*H01L 21/67* (2006.01)
*H01L 21/311* (2006.01)
*H01L 21/66* (2006.01)

(52) U.S. Cl.
CPC .. *H01L 21/67086* (2013.01); *H01L 21/31111* (2013.01); *H01L 21/67253* (2013.01); *H01L 22/26* (2013.01)

(58) Field of Classification Search
None
See application file for complete search history.

(56) References Cited

U.S. PATENT DOCUMENTS

| 6,221,167 B1 * | 4/2001 | Karasawa ................. B08B 3/10 134/1 |
| 2002/0007803 A1 | 1/2002 | Chiu |
| 2015/0380323 A1 * | 12/2015 | Yang ................. H01L 21/67086 438/8 |

FOREIGN PATENT DOCUMENTS

| JP | 4-48630 A | 2/1992 |
| JP | 7-99175 A | 4/1995 |

(Continued)

*Primary Examiner* — Angel Roman
(74) *Attorney, Agent, or Firm* — Muncy, Geissler, Olds & Lowe, P.C.

(57) ABSTRACT

Provided are a substrate processing system and a substrate processing method that can obtain expected etching rate and selection ratio, and perform stable processing. A substrate (11) is soaked in processing liquid (12) stored in a processing bath (14). The processing bath (14) is sealed by cover members (21a and 21b), and the inside is pressurized by water vapor from the heated processing liquid (12). Pure water is consecutively added to the processing liquid (12). Internal pressure of the processing bath (14) is measured, a degree of opening of an exhaust valve (41) is increased or decreased based on the internal pressure (Pa), the internal pressure is kept at constant, a water addition amount of the pure water is increased or decreased based on the internal pressure (Pa), and the substrate (11) is processed using the processing liquid (12) at constant concentration and constant temperature.

5 Claims, 2 Drawing Sheets

(56) References Cited

FOREIGN PATENT DOCUMENTS

| | | |
|---|---|---|
| JP | 11-253894 A | 9/1999 |
| JP | 2002-158200 A | 5/2002 |
| JP | 2003-266033 A | 9/2003 |

* cited by examiner

SUBSTRATE PROCESSING SYSTEM AND SUBSTRATE PROCESSING METHOD

TECHNICAL FIELD

The present invention relates to a substrate processing system and a substrate processing method of a semiconductor wafer or the like.

BACKGROUND ART

There is known a substrate processing system that performs etching by soaking a substrate in processing liquid in a processing bath, for removing part of films on the substrate and forming a desired pattern, or removing all of the films (e.g., refer to Patent Literature 1). In a manufacturing process of a semiconductor device, out of a silicon nitride film ($Si_3N_4$ film) and a silicon dioxide film ($SiO_2$ film) that are formed on a substrate such as a silicon wafer, the silicon nitride film is often selectively eliminated through etching. A phosphoric acid ($H_3PO_4$) aqueous solution is often used as processing liquid for removing the silicon nitride film.

Due to its properties, the phosphoric acid aqueous solution etches not only the silicon nitride film but also a slight amount of the silicon dioxide film. Because minute patterns are required of today's semiconductor devices, it becomes important to keep an etching rate constant for controlling an etching amount, and to keep a selection ratio, which is a ratio between respective etching rates of the silicon nitride film and the silicon dioxide film, constant. As a technique of keeping the etching rate and the selection ratio constant, for example, there is known a method of periodically adding a certain amount of pure water to processing liquid while heating the processing liquid so as to bring the processing liquid into a boiling state.

CITATION LIST

Patent Literature

Patent Literature 1: Japanese Patent Laid-Open No. 2002-158200

SUMMARY OF INVENTION

Technical Problem

Meanwhile, even if a certain amount of pure water is periodically added to processing liquid so as to keep concentration of the processing liquid constant while keeping the processing liquid in the boiling state as described above, variations in the concentration and the temperature of the processing liquid that are caused when the pure water is added are large, and expected etching rate and selection ratio fail to be obtained in some cases. In addition, it has been identified that a change in atmospheric pressure is one of the factors that concentration of processing liquid varies, and expected etching rate and selection ratio fail to be obtained.

The present invention has been devised for solving the above-described problems, and the object of the present invention is to provide a substrate processing system and a substrate processing method that can obtain expected etching rate and selection ratio, and perform stable processing.

Solution to Problem

A substrate processing system of the present invention is a substrate processing system for removing a film on a substrate surface by soaking a substrate in processing liquid including a heated aqueous solution, and includes a processing bath in which the processing liquid is stored, and the substrate is soaked in the processing liquid, a circulation unit configured to return the processing liquid drained from the processing bath, to the processing bath, a processing liquid heating unit configured to heat the processing liquid so that the processing liquid in the processing bath keeps a target temperature, a sealing unit configured to seal the processing bath, a pressure sensor configured to measure internal pressure of the processing bath, a pressure adjustment unit configured to adjust, based on the internal pressure measured by the pressure sensor, internal pressure of the processing bath to target pressure higher than atmospheric pressure, by increasing or decreasing an exhaust amount of water vapor exhausted from an inside of the processing bath to an outside, and a concentration adjustment unit configured to adjust concentration of the processing liquid to be constant, by consecutively adding pure water to the processing liquid via the circulation unit, and increasing or decreasing a water addition amount of the pure water based on the internal pressure measured by the pressure sensor.

In addition, a substrate processing method of the present invention is a substrate processing method for removing a film on a substrate surface by soaking a substrate in processing liquid including a heated aqueous solution, and includes an soaking step of soaking the substrate in the processing liquid stored in a processing bath, a sealing step of sealing the processing bath, a circulation step of returning the processing liquid drained from the processing bath, to the processing bath, a processing liquid heating step of heating the processing liquid so as to keep the processing liquid in the processing bath at a target temperature, a pressure adjustment step of adjusting internal pressure of the processing bath to target pressure higher than atmospheric pressure, by increasing or decreasing an exhaust amount of water vapor exhausted from an inside of the processing bath to an outside, in accordance with internal pressure of the processing bath, and a concentration adjustment step of adjusting concentration of the processing liquid by consecutively adding pure water to the processing liquid circulated by the circulation step, and measuring internal pressure of the processing bath, and increasing or decreasing a water addition amount of the pure water based on the measured internal pressure.

Advantageous Effects of Invention

According to the present invention, based on the internal pressure of the sealed processing bath, an exhaust amount of water vapor is adjusted and the internal pressure of the processing bath is kept at the target pressure higher than atmospheric pressure, an amount of water consecutively added to the circulating processing liquid is increased or decreased based on the internal pressure, and the substrate is processed while keeping the processing liquid in a boiling state. With this configuration, concentration and temperature of the processing liquid are highly-accurately kept constant. Thus, the film can be eliminated using expected etching rate and selection ratio, and stable processing can be performed.

DESCRIPTION OF EMBODIMENT

Figure 1:
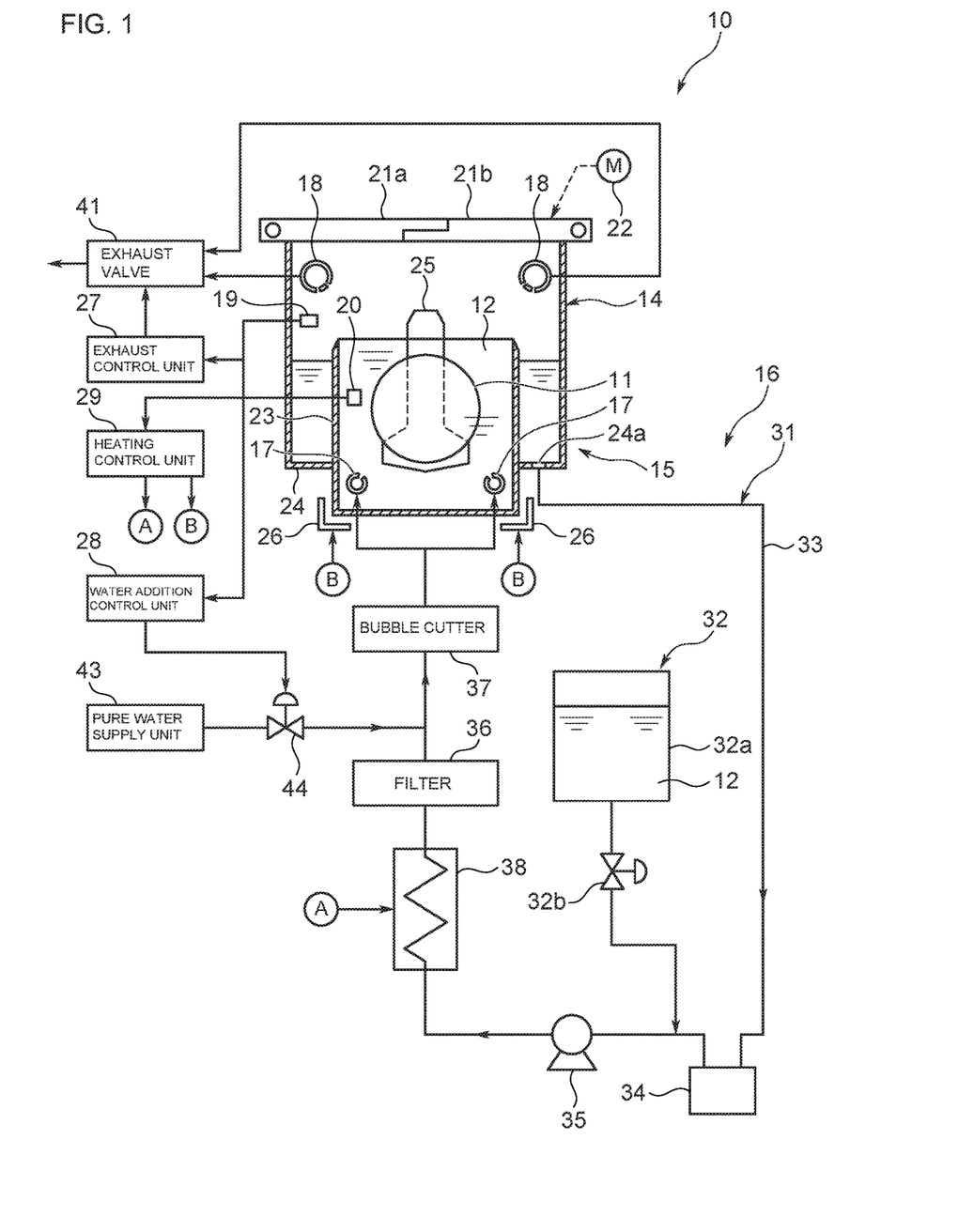
FIG. 1 is a block diagram illustrating a configuration of a substrate processing system.

A substrate processing system 10 illustrated in FIG. 1 is configured to eliminate films formed on a substrate 11. In this example, the substrate 11 is a silicon wafer (semiconductor substrate), and removal processing of selectively removing (etching), out of a silicon dioxide film ($SiO_2$ film) and a silicon nitride film ($Si_3N_4$ film) that are formed on a surface of the substrate 11, the silicon nitride film using processing liquid 12 is performed. As the processing liquid 12, a phosphoric acid aqueous solution obtained by solving phosphoric acid ($H_3PO_4$) in pure water (deionized water) is used. The processing liquid 12 is not limited to the phosphoric acid aqueous solution, and the one suitable for films to be eliminated can be appropriately used.

The substrate processing system 10 mainly includes a substrate processing device 15 and a peripheral device 16. The substrate processing device 15 includes a processing bath 14, a pair of discharge units 17, a pair of exhaust units 18, a pressure sensor 19, and a temperature sensor 20 that are disposed in the processing bath 14, cover members 21a and 21b and a motor 22 that are provided above the processing bath 14, and the like. By keeping internal pressure Pa of the processing bath 14 and concentration of the processing liquid 12 (percentage of solute (phosphoric acid) in phosphoric acid aqueous solution) constant, and furthermore, keeping a boiling state of the processing liquid 12, the substrate processing system 10 is configured to keep the processing liquid 12 at targeted concentration (hereinafter, referred to as target concentration) Cs and at a targeted temperature (hereinafter, referred to as target temperature) Ts, and to process the substrate 11 using the processing liquid 12.

The processing bath 14 has a box-shaped bath main body 23 storing the processing liquid 12, and having an opened upper portion, and an outer bath 24 integrally provided on the outside of the bath main body 23. A plurality of substrates 11 is disposed in the bath main body 23, and these substrates 11 are soaked in the processing liquid 12. The substrates 11 are retained by a holder 25 in a state in which surfaces face each other, and arrayed in the bath main body 23 in a direction perpendicular to a sheet surface in FIG. 1 in an orientation in which each of substrates 11 is rising up. A heater 26 is attached to an outer surface of the bath main body 23, and the heater 26 heats the processing liquid 12 in the bath main body 23.

The pair of discharge units 17 is disposed in a bottom portion of the bath main body 23. A plurality of openings 17a (refer to FIG. 2) is formed in each of the discharge units 17. By the processing liquid 12 being supplied to the discharge units 17, the processing liquid 12 is supplied into the bath main body 23 from each of the openings 17a.

The processing liquid 12 overflowing from an upper opening of the bath main body 23 flows into the outer bath 24. A drain port 24a is provided in a bottom portion of the outer bath 24. The processing liquid 12 that has flowed into the outer bath 24 is drained to a circulation unit 31 via the drain port 24a.

The cover members 21a and 21b serving as a sealing unit are driven by the motor 22, and as illustrated in FIG. 1, rotate between a closed position at which an upper opening of the processing bath 14 is closed in an air-tight manner, and an opened position at which the upper opening of the processing bath 14 is opened. The cover members 21a and 21b are set at the opened position, and through the opened upper opening of the processing bath 14, the substrates 11 are disposed in the bath main body 23 in the processing bath 14, and furthermore, the substrates 11 are taken out from the bath main body 23 to the outside of the processing bath 14.

During the processing of the substrates 11, the cover members 21a and 21b are set at the closed position, and the processing bath 14 is sealed. With this configuration, as mentioned later, water vapor generated from the heated processing liquid 12 pressurizes the inside of the processing bath 14, and the internal pressure Pa is made higher than atmospheric pressure, and a boiling point of the processing liquid 12 is made higher. In addition, phosphoric acid and water in the phosphoric acid aqueous solution serving as the processing liquid 12 do not become azeotropic. The boiling point to be focused on this example is a boiling point of water in the processing liquid 12, and the boiling point of the processing liquid 12 is used as a term meaning the boiling point of water in the processing liquid 12.

During the processing of the substrates 11, the cover members 21a and 21b are locked at the closed position so as not to be opened by the internal pressure Pa. In addition, airtightness made by the cover members 21a and 21b and the processing bath 14 is preferably high, but is only required to be able to obtain, as the internal pressure Pa, pressure (hereinafter, referred to as target pressure) Ps set to be higher than atmospheric pressure. In addition, a configuration in which the processing bath 14 is disposed in a chamber having airtightness may be employed.

The upper opening of the processing bath 14, that is, an upper end of an outer wall of the processing bath 14 (the outer bath 24) is positioned above a liquid surface of the processing liquid 12 stored in the processing bath 14. With this configuration, a space (hereinafter, referred to as a space in bath) surrounded by the liquid surface, the cover members 21a and 21b, and the outer wall of the processing bath 14 is formed above the liquid surface of the stored processing liquid 12. In the space in bath, the pair of exhaust units 18 and the pressure sensor 19 are disposed.

The pressure sensor 19 measures pressure of the space in bath, that is, the internal pressure Pa of the processing bath 14. The pressure sensor 19 sends the measured internal pressure Pa to an exhaust control unit 27 and a water addition control unit 28. One purpose of measuring the internal pressure Pa is to keep the internal pressure Pa constant without being affected by atmospheric pressure. For this reason, the internal pressure Pa measured by the pressure sensor 19 is not relative pressure that is based on varying atmospheric pressure, but pressure measured based on constant pressure, such as absolute pressure, for example. In addition, the exhaust units 18 will be mentioned later.

The temperature sensor 20 is disposed in the bath main body 23, and measures temperature Ta of the processing liquid 12. The temperature Ta measured by the temperature sensor 20 is sent to a heating control unit 29, and is used for the control of heating of the processing liquid 12.

The peripheral device 16 includes the circulation unit 31 that circulates the processing liquid 12, a processing liquid supply unit 32 that supplies the processing liquid 12, and the like. The circulation unit 31 is configured to return the processing liquid 12 drained from the processing bath 14, to the processing bath 14. The circulation unit 31 includes a pipe 33 linking between the drain port 24a of the outer bath 24 and the discharge units 17 in the bath main body 23, and a damper 34, a circulation pump 35, a filter 36, and a bubble cutter 37 that are connected to halfway points of the pipe 33.

In addition, an inline heater 38 constituting a processing liquid heating unit is connected to a halfway point of the pipe 33.

The circulation pump 35 sends the processing liquid 12 drained from the drain port 24a, toward the discharge units 17 at appropriate pressure. The processing liquid 12 is thereby discharged into the bath main body 23 from each of the openings 17a of the discharge units 17. The damper 34 is provided on an upstream side (the drain port 24a side) of the circulation pump 35. The damper 34 is provided for enabling a constant amount of the processing liquid 12 to be constantly supplied even if an exhaust amount of the processing liquid 12 drained from the drain port 24a varies, and stores an appropriate amount of the processing liquid 12 drained from the drain port 24a, and supplies the stored processing liquid 12 to the circulation pump 35.

The inline heater 38 is connected to a downstream side of the circulation pump 35, and the inline heater 38 heats the processing liquid 12 to be supplied to the bath main body 23. The inline heater 38 is controlled by the heating control unit 29. The filter 36 and the bubble cutter 37 are connected in series to a downstream side of the inline heater 38. The filter 36 eliminates particles in the processing liquid 12, and the bubble cutter 37 eliminates air bubbles in the processing liquid 12.

The processing liquid supply unit 32 is provided for supplying new processing liquid 12, and includes a processing liquid tank 32a in which the processing liquid 12 adjusted to constant concentration is stored, and a supply valve 32b. The processing liquid tank 32a is connected to the pipe 33 via the supply valve 32b on the upstream side of the circulation pump 35. In the case of newly storing the processing liquid 12 in the bath main body 23, the supply valve 32b is opened, and pressure feed is performed by the circulation pump 35.

The exhaust units 18, the pressure sensor 19, the exhaust control unit 27, and an exhaust valve 41 constitute a pressure adjustment unit. The exhaust units 18 disposed in the space in bath have a tubular shape in which a plurality of openings 18a (refer to FIG. 2) is formed. The exhaust valve 41 is provided on the outside of the processing bath 14. One end of each of the exhaust units 18 is connected to the exhaust valve 41, and the exhaust units 18 are communicated with the outside of the processing bath 14 via the exhaust valve 41. In addition, an exhaust duct (not illustrated) is connected to the exhaust valve 41. By a difference between the internal pressure Pa of the processing bath 14 and pressure on the outside of the processing bath 14 (pressure on an exhaust duct side), water vapor in the processing bath 14 is exhausted to the outside of the processing bath 14 via the exhaust units 18 and the exhaust valve 41.

By adjusting a degree of opening of the exhaust valve 41 based on the internal pressure Pa measured by the pressure sensor 19, the exhaust control unit 27 increases or decreases an amount of water vapor exhausted from the inside of the processing bath 14. With this configuration, the internal pressure Pa is kept at the constant target pressure Ps without being affected by atmospheric pressure, and the boiling point of the processing liquid 12 is made higher. As mentioned above, the target pressure Ps is set to be higher than atmospheric pressure.

For example, the exhaust control unit 27 monitors a varying state of the internal pressure Pa, and adjusts the degree of opening of the exhaust valve 41 based on the varying state. The degree of opening of the exhaust valve 41 is thereby adjusted to be appropriate for the target pressure Ps. More specifically, for example, at every certain period, average pressure and standard deviation of internal pressures Pa in the period are obtained, and in a case where the standard deviation exceeds a threshold value, the degree of opening of the exhaust valve 41 is increased or decreased with an adjustment amount set in accordance with a difference between the average pressure and the target pressure Ps. When the average pressure is higher than the target pressure Ps, the degree of opening of the exhaust valve 41 is proportionally increased in accordance with the difference therebetween, and when the average pressure is lower, the degree of opening of the exhaust valve 41 is proportionally decreased in accordance with the difference therebetween. In a case where the standard deviation is equal to or smaller than a predetermined value, the exhaust control unit 27 maintains the degree of opening of the exhaust valve 41 that is set at the time.

The pressure sensor 19, the water addition control unit 28, a pure water supply unit 43, and a water supply valve 44 constitute a concentration adjustment unit. The pure water supply unit 43 includes, for example, a tank storing pure water (deionized water), and the like. The degree of opening of the water supply valve 44 is adjusted by the control of the water addition control unit 28 that is performed based on the internal pressure Pa measured by the pressure sensor 19, and an amount of water addition, that is, an amount of pure water added to the processing liquid 12 per unit time when pure water is added (hereinafter, the amount of pure water added per unit time will be referred to as a water addition amount) is adjusted. In this example, water is added to the processing liquid 12 flowing in the pipe 33 provided between the filter 36 and the bubble cutter 37.

The water addition control unit 28 increases or decreases the degree of opening of the water supply valve 44 while constantly maintaining the water supply valve 44 in an opened state. The water addition amount is thereby increased or decreased while consecutively adding pure water to the processing liquid 12. By consecutively adding water to the processing liquid 12, a change in concentration of the processing liquid 12 that is caused by water addition is suppressed to be small. In this manner, while suppressing a variation in the concentration of the processing liquid 12 by consecutive water addition to the processing liquid 12 and an increase or a decrease in water addition amount, the concentration of the processing liquid 12 is kept at the target concentration Cs. In addition, pure water may be added to the processing liquid 12 after being heated.

The internal pressure Pa in the substrate processing system 10 rises to pressure decided in accordance with atmospheric pressure, the degree of opening of the exhaust valve 41, the concentration of the processing liquid 12, magnitude of heat energy input from the heater 26, and the like. Meanwhile, the internal pressure Pa rises or is maintained by water vapor generated by the boiling of the processing liquid 12, and when the concentration of the processing liquid 12 remains the same, if the internal pressure Pa becomes higher, the boiling point of the processing liquid 12 becomes higher. Furthermore, as well known, under the same internal pressure Pa, an increase in the concentration of the processing liquid 12 increases the boiling point.

Thus, in the substrate processing system 10, the concentration of the processing liquid 12 can take a dominant position for the internal pressure Pa and the boiling point of the processing liquid 12. Here, in a state in which the processing liquid 12 is boiling, the temperature Ta of the processing liquid 12 matches the boiling point. In other words, in the substrate processing system 10 that keeps the processing liquid 12 in a boiling state, a change in the concentration of the processing liquid 12 can be a major factor of changing the internal pressure Pa and the temperature Ta of the processing liquid 12. In addition, because the temperature of the processing liquid 12 is controlled with targeting on the target temperature Ts, a possible range of the temperature Ta does not largely exceed the target temperature Ts even if the internal pressure Pa becomes excessively high.

Thus, in the substrate processing system 10, by rather utilizing the above-described phenomenon, a water addition amount is increased or decreased in accordance with the internal pressure Pa, and the concentration of the processing liquid 12 is kept at the target concentration Cs. More specifically, first of all, the water addition amount is increased until the internal pressure Pa reaches the target pressure Ps, and the water addition amount is adjusted so that the internal pressure Pa becomes constant at a stage at which the internal pressure Pa reaches the target pressure PS. In this initial state, water in the processing liquid 12 becomes an excess state, and a state in which the concentration of the processing liquid 12 is lower than the target concentration Cs, and the internal pressure Pa is higher than the target pressure Ps is caused. After the initial state is caused in this manner, the water addition amount is adjusted using a water addition amount in this initial state as an initial water addition amount. In the adjustment of the water addition amount, each time the internal pressure Pa is measured, the internal pressure Pa and the target pressure Ps are compared, and in a case where the internal pressure Pa is lower than the target pressure Ps, the water addition amount is made larger than the initial water addition amount, and in a case where the internal pressure Pa is higher than the target pressure Ps, the water addition amount is made smaller than the initial water addition amount. The increase and decrease of the water addition amount are proportionally performed based on the initial water addition amount with respect to a difference between the internal pressure Pa and the target pressure Ps, for example.

The temperature sensor 20, the heating control unit 29, the heater 26, and the inline heater 38 constitute a processing liquid heating unit that heats the processing liquid 12. The heating control unit 29 controls the driving of the heater 26 and the inline heater 38. The heater 26 heats the processing liquid 12 in the bath main body 23 using constant output (heat energy). The output of the inline heater 38 on the other hand is controlled by the heating control unit 29 based on the temperature Ta of the processing liquid 12 that has been measured by the temperature sensor 20, so as to keep the processing liquid 12 at the target temperature Ts. More specifically, in a case where the temperature Ta of the processing liquid 12 has not reached the target temperature Ts, the output of the inline heater 38 is made higher so as to increase the temperature Ta, and in a case where the temperature Ta of the processing liquid 12 exceeds the target temperature Ts, the output is made lower so that the temperature Ta decreases by heat release or the like. In a case where the temperature Ta of the processing liquid 12 is the same as the target temperature Ts, the inline heater 38 is controlled to predetermined output that considers heat release or the like, so as to keep the temperature Ta. The target temperature Ts is a boiling point (saturation temperature) of water in the processing liquid 12 at the target concentration Cs that is set when the internal pressure Pa is at the target pressure Ps.

Figure 2:
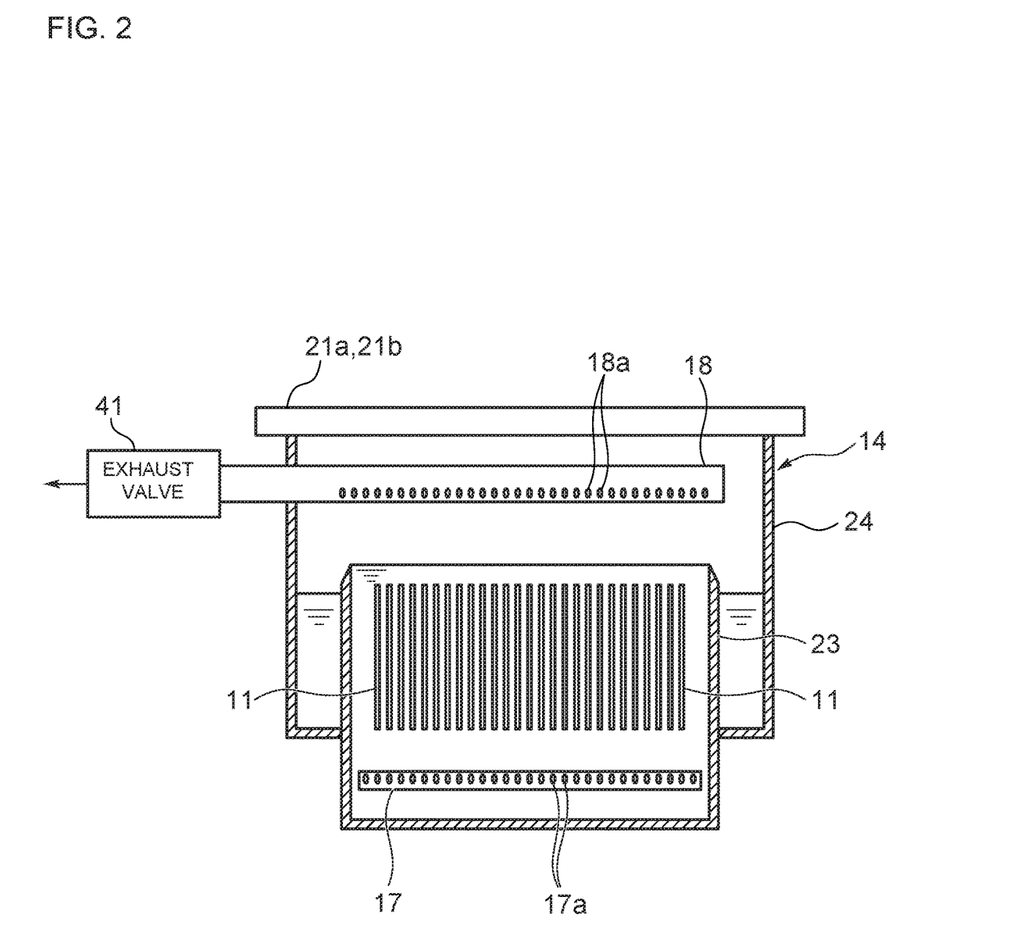
FIG. 2 is an explanatory diagram illustrating arrangement of an exhaust unit.

As illustrated in FIG. 2, each of the discharge units 17 has a tubular shape, and is disposed along the plurality of arrayed substrates 11. In the discharge units 17, the plurality of openings 17a is formed in a range in which the substrates 11 are arrayed. With this configuration, processing liquid constantly flows uniformly on the surfaces of the substrates 11. Similarly, the exhaust units 18 have a tubular shape, and are disposed along the plurality of arrayed substrates 11. In the exhaust units 18, the plurality of openings 18a is formed in a portion corresponding to the range in which the substrates 11 are arrayed. By using the exhaust units 18 in which the plurality of openings 18a is formed in this manner, water vapor is uniformly sucked from a region in the space in bath that corresponds to the range in which the substrates 11 are arrayed, and pressure in the region is uniformized. This uniformizes the boiling point of the processing liquid 12 within the range in which the substrates 11 are arrayed. The configuration of the exhaust units 18 is not limited to the above-described configuration. In addition, in FIG. 2, the illustration of the holder 25, the pressure sensor 19, and the like is omitted.

Next, an operation of the above-described configuration will be described. The processing liquid 12 is supplied in advance to the bath main body 23 from the processing liquid supply unit 32 via the circulation unit 31. In addition, a state in which the bath main body 23 is filled with the processing liquid 12 and the processing liquid 12 is caused to circulate by the circulation unit 31 is caused. A state in which the cover members 21a and 21b are set at the opened position and the upper opening of the processing bath 14 is opened is caused. At this time, because the inline heater 38 heats the processing liquid 12 so as to be the target temperature Ts, under the control of the heating control unit 29, for example, the processing liquid 12 is in the boiling state under atmospheric pressure. In addition, in a state in which the upper opening of the processing bath 14 is opened, water addition is consecutively performed using a predetermined water addition amount.

The processing target substrates 11 in a state of being retained by the holder 25 are brought into the processing bath 14 from the upper opening of the processing bath 14, and disposed in the bath main body 23. The substrates 11 are thereby soaked in the processing liquid 12. By soaking the substrates 11 in the processing liquid 12, a temperature decrease occurs in the processing liquid 12, but the heating control unit 29 makes the output of the inline heater 38 higher in response to the temperature decrease. Thus, in a short time, the temperature Ta of the processing liquid 12 reaches a boiling point corresponding to current internal pressure Pa (almost the same as atmospheric pressure), and the processing liquid 12 becomes the boiling state.

After the substrates 11 are soaked, the cover members 21a and 21b are rotated to the closed position, and the processing bath 14 is sealed. At this time, the exhaust valve 41 is set to a normal degree of opening, for example. In addition, even after the processing bath 14 is sealed, heating of the processing liquid 12 is continued by the heater 26 and the inline heater 38, and the output of the inline heater 38 is controlled by the heating control unit 29 so that the processing liquid 12 reaches the target temperature Ts.

If the processing bath 14 is sealed, the internal pressure Pa rises due to water vapor generated by the boiling of processing liquid 14 in the processing bath 14. If the internal pressure Pa rises, by a difference between the internal pressure Pa and pressure on the outside of the processing bath 14, water vapor in the processing bath 14 is exhausted to the outside of the processing bath 14 through the exhaust units 18 and the exhaust valve 41. At this time, water vapor in the processing bath 14 is sucked into the exhaust units 18 from each of the openings 18a of the exhaust units 18. The water vapor is accordingly sucked uniformly from the region in the space in bath that corresponds to the range in which the substrates 11 are arrayed.

Because an amount of water vapor exhausted from the exhaust units 18 is restricted in accordance with the degree of opening of the exhaust valve 41, the internal pressure Pa gradually rises. In addition, in accordance with the rise of the internal pressure Pa, the boiling point of the processing liquid 14 rises, and in accordance with the rise of the boiling point, the temperature Ta of the processing liquid 12 rises, so that the processing liquid 12 becomes the boiling state. As mentioned above, the internal pressure Pa rises to pressure decided in accordance with atmospheric pressure, the degree of opening of the exhaust valve 41, the concentration of the processing liquid 12, and the like, and at the boiling point corresponding to the internal pressure Pa, the processing liquid 12 becomes the boiling state. In addition, at this time, because heating performed by the inline heater 38 is controlled with targeting on the target temperature Ts, even if the concentration of the processing liquid 12 is high, the temperature Ta of the processing liquid 12 does not become so high as to largely exceed the target temperature Ts, and the internal pressure Pa is accordingly restricted as well.

For example, after the lapse of an appropriate time assumed to be required for reaching the target temperature Ts, from when the processing bath 14 is sealed, measurement of the internal pressure Pa that is performed by the pressure sensor 19 is started, and internal pressures Pa sequentially measured by the pressure sensor 19 are sent to the exhaust control unit 27 and the water addition control unit 28. Based on the measured internal pressures Pa, adjustment of the degree of opening of the exhaust valve 41 that is performed by the exhaust control unit 27, and adjustment of the degree of opening of the water supply valve 44 that is performed by the water addition control unit 28 are started.

While monitoring the measured internal pressures Pa, the water addition control unit 28 gradually increases the degree of opening of the water supply valve 44 to increase a water addition amount. If the internal pressures Pa reaches the target pressure Ps, subsequently, a water addition amount is adjusted so that the internal pressure Pa becomes constant, and adjustment of a water addition amount is started for causing the concentration of the processing liquid 12 to become the target concentration Cs, using the adjusted water addition amount as an initial water addition amount. As mentioned above, in the initial state in which the water addition amount has been adjusted in this manner, water in the processing liquid 12 becomes an excess state, and a state in which the concentration of the processing liquid 12 is lower than the target concentration Cs, and the internal pressure Pa is higher than the target pressure Ps is caused.

If the adjustment of the water addition amount is started, the water addition control unit 28 compares the measured internal pressure Pa and the target pressure Ps. Then, if the internal pressure Pa is lower than the target pressure Ps, the degree of opening of the water supply valve 44 is adjusted so as to add water to the processing liquid 12 using a new water addition amount increased from the initial water addition amount currently-used for water addition. In contrast, if the internal pressure Pa is higher than the target pressure Ps, the degree of opening of the water supply valve 44 is adjusted so as to add water to the processing liquid 12 using a new water addition amount decreased from the initial water addition amount. The water addition control unit 28 compares the measured internal pressure Pa and the target pressure Ps, and if the internal pressure Pa is lower than the target pressure Ps, the degree of opening of the water supply valve 44 is adjusted so as to add water to the processing liquid 12 using a new water addition amount increased from the initial water addition amount currently-used for water addition. In contrast, if the internal pressure Pa is higher than the target pressure Ps, the degree of opening of the water supply valve 44 is adjusted so as to add water to the processing liquid 12 using a new water addition amount decreased from the initial water addition amount.

On the other hand, based on the input internal pressures Pa, at every certain period, the exhaust control unit 27 obtains average pressure and standard deviation of the internal pressures Pa in the period. Then, each time average pressure and standard deviation of one period are obtained, the standard deviation is compared with a threshold value, and in a case where the standard deviation exceeds the threshold value, the exhaust control unit 27 secondly compares the average pressure and the target pressure Ps. In this comparison, if the average pressure is larger than the target pressure Ps, the exhaust control unit 27 increases the degree of opening of the exhaust valve 41, to increase an amount of water vapor exhausted from the processing bath 14. In contrast, if an average value is smaller than the target pressure Ps, the exhaust control unit 27 decreases the degree of opening of the exhaust valve 41, to decrease an amount of water vapor exhausted from the processing bath 14. On the other hand, if the standard deviation is equal to or smaller than the threshold value, the degree of opening of the exhaust valve 41 at the time point is maintained.

For example, when atmospheric pressure and the like are taken into account, in a case where the degree of opening of the exhaust valve 41 is large with respect to the target pressure Ps, the internal pressure Pa becomes easier to decrease, and an increase/decrease range of the water addition amount of the water addition control unit 28 becomes larger. Thus, a variation in the internal pressure Pa, that is, the standard deviation becomes larger, and furthermore, the average pressure of the internal pressures Pa shows a tendency to be smaller than the target pressure Ps. In this case, the degree of opening of the exhaust valve 41 is made small. As a result, a state in which the internal pressure Pa is more difficult to decrease than ever before is caused. Thus, an increase/decrease width of the water addition amount of the water addition control unit 28 becomes smaller, a variation in the internal pressure Pa becomes smaller, and the average pressure of the internal pressures Pa comes closer to the target pressure Ps.

In contrast, in a case where the degree of opening of the exhaust valve 41 is smaller with respect to the target pressure Ps, the internal pressure Pa becomes easier to increase, and an increase/decrease width of the water addition amount of the water addition control unit 28 becomes larger. Thus, a variation in the internal pressure Pa, that is, the standard deviation similarly becomes larger. Nevertheless, the average pressure of the internal pressures Pa shows a tendency to be larger than the target pressure Ps. Accordingly, in this case, the degree of opening of the exhaust valve 41 is made large. As a result, a state in which the internal pressure Pa is more difficult to increase than ever before is caused. Thus, an increase/decrease width of the water addition amount of the water addition control unit 28 becomes smaller, a variation in the internal pressure Pa becomes smaller, and the average pressure of the internal pressures Pa comes closer to the target pressure Ps.

In the above-described manner, consecutive adjustment of a water addition amount and adjustment of the degree of opening of the exhaust valve 41 that is performed in accordance with average pressure and standard deviation that are obtained at every certain period are repeated. As a result, the internal pressure Pa converges to the target pressure Ps, and furthermore, the concentration of the processing liquid 12 converges to the target concentration Cs. In addition, by the internal pressure Pa converging to the target pressure Ps, the boiling point of the processing liquid 12 converges to the constant target temperature Ts.

Even after the internal pressure Pa becomes the target pressure Ps, measurement of the internal pressure Pa that is performed by the pressure sensor 19 is continued, and based on the measurement result, the adjustment of an amount of exhaust performed by the exhaust valve 41 and the adjustment of a water addition amount with respect to the processing liquid 12 are repeatedly performed similarly to the foregoing. With this configuration, the internal pressure Pa is kept at the target pressure Ps, a water addition amount in consecutive water addition is increased or decreased, and the concentration of the processing liquid 12 is kept at the target concentration Cs.

In addition, as described above, the internal pressure Pa is kept at the constant target pressure Ps regardless of atmospheric pressure, and furthermore, the processing liquid 12 is kept at the constant target concentration Cs. Thus, the boiling point of the processing liquid 12 is kept at the constant target temperature Ts. In addition, because the processing liquid 12 is heated and the boiling state is kept, the processing liquid 12 is kept at the target temperature Ts. As a result, the substrates 11 are processed using the processing liquid 12 kept at the target temperature Ts and the target concentration Cs.

In addition, the exhaust units 18 that exhaust water vapor from the inside of the processing bath 14 suck and exhaust water vapor from the inside of the processing bath 14 from the plurality of openings 18a provided in a portion corresponding to a range in which the substrates 11 are arrayed. Thus, water vapor is uniformly sucked from the region in the space in bath that corresponds to the range in which the substrates 11 are arrayed. Thus, the pressure of the region in the space in bath does not become non-uniform, and the boiling point of the processing liquid 12 provided immediately below the region does not become non-uniform. Thus, all of the substrates 11 are processed using the processing liquid 12 at the same target temperature Ts.

If a predetermined time elapses, after the cover members 21a and 21b are moved to the opened position, the substrates 11 are taken out from the processing bath 14 together with the holder 25. Because the taken-out substrates 11 have been processed using the processing liquid 12 kept at the target temperature Ts and the target concentration Cs as described above, out of a silicon dioxide film and a silicon nitride film, the silicon nitride film has been eliminated using expected etching rate and selection ratio. In addition, if the cover members 21a and 21b are moved to the opened position, water addition is consecutively performed using a predetermined water addition amount.

REFERENCE SIGNS LIST 10 substrate processing system
11 substrate
12 processing liquid
14 processing bath
18 exhaust unit
19 pressure sensor
21a, 21b cover member
26 heater
27 exhaust control unit
28 water addition control unit
31 circulation unit
38 inline heater
41 exhaust valve
43 pure water supply unit
44 water supply valve

The invention claimed is:

1. A substrate processing system for removing films on substrate surfaces of a plurality of substrates by soaking the substrates in processing liquid including a heated aqueous solution, the substrate processing system comprising:
   a processing bath in which the processing liquid is stored, and the substrates are soaked in the processing liquid;
   a circulation unit configured to return the processing liquid drained from the processing bath, to the processing bath;
   a processing liquid heating unit configured to heat the processing liquid so that the processing liquid in the processing bath keeps a target temperature;
   a sealing unit configured to seal the processing bath;
   a pressure sensor configured to measure internal pressure of the processing bath;
   a pressure adjustment unit configured to adjust, based on the internal pressure measured by the pressure sensor, internal pressure of the processing bath to target pressure higher than atmospheric pressure, by increasing or decreasing an exhaust amount of water vapor exhausted from an inside of the processing bath to an outside;
   a concentration adjustment unit configured to adjust concentration of the processing liquid to be constant, by consecutively adding pure water to the processing liquid via the circulation unit, and increasing or decreasing a water addition amount of the pure water based on the internal pressure measured by the pressure sensor, wherein
   the substrates are arrayed in the processing bath,
   the pressure adjustment unit includes a tubular-shaped exhaust unit disposed along the substrates in a space above the processing liquid, and communicated with an outside at one end, and
   in the exhaust unit, a plurality of openings for sucking water vapor in the processing bath is formed in an array range of the substrates.

2. The substrate processing system according to claim 1, wherein the pressure adjustment unit includes an exhaust valve connected to the exhaust unit, and an exhaust control unit configured to increase or decrease a degree of opening of the exhaust valve based on the internal pressure measured by the pressure sensor.

3. The substrate processing system according to claim 1, wherein each of the substrates is a silicon wafer on which a silicon dioxide film and a silicon nitride film are formed on the substrate surface, and the processing liquid is a phosphoric acid aqueous solution.

4. The substrate processing system according to claim 1, wherein the pressure adjustment unit increases or decreases an exhaust amount of the water vapor based on a varying state of the internal pressure.

5. A substrate processing method for removing films on substrate surfaces of a plurality of substrates by soaking the substrates in processing liquid including a heated aqueous solution, the substrate processing method comprising:
   a soaking step of soaking the substrates in the processing liquid stored in a processing bath wherein the substrates are arrayed in the processing bath;
   a sealing step of sealing the processing bath;

a circulation step of returning the processing liquid drained from the processing bath, to the processing bath;

a processing liquid heating step of heating the processing liquid so as to keep the processing liquid in the processing bath at a target temperature;

a pressure adjustment step of adjusting internal pressure of the processing bath to target pressure higher than atmospheric pressure, by increasing or decreasing an exhaust amount of water vapor exhausted from an inside of the processing bath to an outside, in accordance with internal pressure of the processing bath wherein the water vapor is exhausted to the outside by being sucked through a plurality of openings that is formed in an array range of the substrates in a tubular-shaped exhaust unit, the tubular-shaped exhaust unit being disposed along the substrates in a space above the processing liquid in the processing bath and being communicated with the outside at one end; and a concentration adjustment step of adjusting concentration of the processing liquid by consecutively adding pure water to the processing liquid circulated by the circulation step, and measuring internal pressure of the processing bath, and increasing or decreasing a water addition amount of the pure water based on the measured internal pressure.

* * * * *